US012399522B2

United States Patent
Choi et al.

(10) Patent No.: US 12,399,522 B2
(45) Date of Patent: Aug. 26, 2025

(54) BAND GAP REFERENCE CIRCUIT UNDER LOW SUPPLY VOLTAGE

(71) Applicant: LX SEMICON CO., LTD., Daejeon (KR)

(72) Inventors: Harim Choi, Daejeon (KR); Kyung Min Shin, Daejeon (KR); Yongsung Ahn, Daejeon (KR)

(73) Assignee: LX SEMICON CO., LTD., Daejeon (KR)

( * ) Notice: Subject to any disclaimer, the term of this patent is extended or adjusted under 35 U.S.C. 154(b) by 4 days.

(21) Appl. No.: 18/518,770

(22) Filed: Nov. 24, 2023

(65) Prior Publication Data

US 2024/0176378 A1 May 30, 2024

(30) Foreign Application Priority Data

Nov. 25, 2022 (KR) .......................... 10-2022-0160489
Jun. 26, 2023 (KR) .......................... 10-2023-0081592

(51) Int. Cl.
*G05F 3/30* (2006.01)
*G05F 1/46* (2006.01)
*G05F 3/20* (2006.01)

(52) U.S. Cl.
CPC ................ *G05F 3/20* (2013.01); *G05F 1/468* (2013.01); *G05F 3/30* (2013.01)

(58) Field of Classification Search
USPC .................. 323/312–317; 327/512, 513, 539
See application file for complete search history.

(56) References Cited

U.S. PATENT DOCUMENTS 4,242,693 A 12/1980 Biran
4,795,961 A * 1/1989 Neidorff .................. G05F 3/30
  323/907

(Continued)

FOREIGN PATENT DOCUMENTS

KR  10-2006-0088163 A  8/2006
KR    10-1465598 B1  12/2014

OTHER PUBLICATIONS

Yueming Jiang and Edward K.F. Lee, A 1.2 V Bandgap Reference Based on Transimpedance Amplifier, May 2005, IEEE, IEEE International Symposium on Circuits and systems, ISCAS 2000 (Year: 2000).*

(Continued)

*Primary Examiner* — Thomas J. Hiltunen
(74) *Attorney, Agent, or Firm* — ROTHWELL, FIGG, ERNST AND MANBECK, P.C.

(57) ABSTRACT

Proposed is a band gap reference circuit under a low supply voltage capable of generating a band gap reference voltage even under a low supply voltage by using a plurality of bias voltages separately generated and a current source using these bias voltages without using a diode connected structure used in the related art while not being affected by limitations in the operating voltage of a bipolar transistor. The band gap reference circuit under a low supply voltage includes a voltage reference main circuit configured to generate a first node voltage and a second node voltage in response to a first bias voltage and a band gap reference voltage, and a transimpedance amplifier configured to generate the band gap reference voltage by amplifying a difference between the first node voltage and the second node voltage using the first bias voltage, a second bias voltage, and a third bias voltage.

18 Claims, 5 Drawing Sheets

(56) References Cited

U.S. PATENT DOCUMENTS

| | | | |
|---|---|---|---|
| 6,680,643 B2* | 1/2004 | Conte | G05F 3/30 |
| | | | 327/539 |
| 9,582,021 B1* | 2/2017 | Arnold | G05F 3/16 |
| 11,526,191 B2* | 12/2022 | Sreenivasan | G05F 3/30 |
| 2007/0024325 A1* | 2/2007 | Chen | G11C 7/04 |
| | | | 327/55 |
| 2009/0302824 A1 | 12/2009 | Kim et al. | |
| 2015/0227156 A1 | 8/2015 | Kobayashi | |
| 2019/0109243 A1* | 4/2019 | Zhang | H01G 7/00 |
| 2021/0131865 A1 | 5/2021 | Yang et al. | |

OTHER PUBLICATIONS

Partial European Search Report dated Jul. 25, 2024, issued for the corresponding European patent application EP 1 23212179.8, 16 pages.
Extended European Search Report issued for European Application No. 23212179.8 on Dec. 2, 2024, 16 pages.

* cited by examiner

BAND GAP REFERENCE CIRCUIT UNDER LOW SUPPLY VOLTAGE

This application claims the benefit of earlier filing date and right of priority to Korean Application No. 10-2022-0160489, filed on Nov. 25, 2022, and Korean Application No. 10-2023-0081592, filed on Jun. 26, 2023, the contents of which are hereby incorporated by reference herein in their entirety.

BACKGROUND

1. Technical Field

The present disclosure relates to a band gap reference circuit, and more particularly, to a band gap reference circuit under a low supply voltage capable of generating a band gap reference voltage in a semiconductor device having a low level of an operating voltage.

2. Related Art

Semiconductor devices include various circuits for generating, processing, and storing data. Such semiconductor devices receive voltages having various voltage levels from an external power source or operate using a voltage (hereinafter, referred to as a reference voltage) generated inside a circuit. Since a reference voltage generation circuit that generates a voltage having a specific voltage level includes an element with electrical characteristics varying depending on the temperature of a semiconductor device, the level of a reference voltage generated varies depending on the temperature of a corresponding semiconductor device even in a reference voltage generation circuit implemented in the same semiconductor.

Circuits implemented in a semiconductor device operate according to a reference voltage supplied, and when the voltage level of a band gap reference voltage varies, output values of the circuits also vary, which is not what a circuit designer wants.

In order to prevent abnormal operations of the circuits implemented in the semiconductor device or operations in a manner not desired by the designer and to ensure the circuit reliability, a band gap reference circuit that generates a band gap reference voltage is used.

The band gap reference circuit is a circuit that generates a band gap reference voltage insensitive to changes in the temperature of the semiconductor device by using a band gap of silicon being a material of the semiconductor device. The band gap refers to an energy region where a charge state density between a valence band and a conduction band is zero in a semiconductor and an insulator and the energy difference, and the electrical conductivity of a material is determined by the size of the band gap.

FIG. 1 is a diagram illustrating an example of a band gap reference circuit 100 in the related art.

Referring to FIG. 1, the band gap reference circuit 100 in the related art generates a band gap reference voltage $V_{REF}$ insensitive to temperature changes by using two bipolar transistors Q1 and Q2 having different areas so that a component proportional to changes in absolute temperature (proportional to absolute temperature (PTAT)) and a component inversely proportional to changes in absolute temperature (complementary to absolute temperature (CTAT)) are offset to each other.

Since the electrical operating characteristics of the band gap reference circuit 100 illustrated in FIG. 1 are known to those skilled in the art, description thereof will be omitted.

The voltage level of a reference voltage used in the circuit is closely related to the power consumption of the circuit. For example, it can be easily expected that the power consumption of a circuit operating between 5 V (volts) and a ground voltage GND is greater than the power consumption of a circuit operating between 3 V and a ground voltage. Recently, in order to minimize the power consumption of a semiconductor device, the voltage level of a supply voltage of the semiconductor device tends to be reduced.

Referring to FIG. 1, it is disadvantageous that a metal oxide silicon transistor M4, in which a source terminal is connected to a power supply voltage $V_{DD}$ and gate and drain terminals are diode connected to be connected to the bipolar transistor Q2, may limit the operating voltage range of the bipolar transistor Q2 by a difference voltage $V_{DD}$-$V_D$ between the power supply voltage $V_{DD}$ and a voltage $V_D$ of the drain terminal.

When the voltage level of a power supply voltage of a semiconductor device is reduced, the operation of a band gap reference circuit may not be possible.

SUMMARY

Various embodiments are directed to providing a band gap reference circuit under a low supply voltage capable of generating a band gap reference voltage even under a low supply voltage by using a plurality of bias voltages separately generated and a current source using these bias voltages without using a diode connected structure used in the related art while not being affected by limitations in the operating voltage of a bipolar transistor.

Technical problems to be achieved in the present disclosure are not limited to the aforementioned technical problems and the other unmentioned technical problems will be clearly understood by those skilled in the art from the following description.

A band gap reference circuit under a low supply voltage according to an aspect of the present disclosure includes: a voltage reference main circuit configured to generate a first node voltage and a second node voltage in response to a first bias voltage and a band gap reference voltage; and a transimpedance amplifier configured to generate the band gap reference voltage by amplifying a difference between the first node voltage and the second node voltage using the first bias voltage, a second bias voltage, and a third bias voltage.

A band gap reference circuit under a low supply voltage according to another aspect of the present disclosure includes: a voltage reference main circuit configured to generate a first node voltage and a second node voltage in response to a first bias voltage and a band gap reference voltage; a bias stage configured to generate a fourth node voltage by using a second bias voltage, a third bias voltage, the first node voltage, and the second node voltage; and an inter amplifying stage configured to generate the band gap reference voltage by amplifying the fourth node voltage using the first bias voltage.

Technical problems to be achieved in the present disclosure are not limited to the aforementioned technical problems and the other unmentioned technical problems will be clearly understood by those skilled in the art from the following description.

A band gap reference circuit under a low supply voltage according to the present disclosure as described above has the advantage capable of generating a band gap reference voltage even under a low supply voltage by using a plurality of bias voltages separately generated and a current source using these bias voltages without using a diode connected structure used in the related art while not being affected by limitations in the operating voltage of a bipolar transistor.

Effects achievable in the disclosure are not limited to the aforementioned effects and the other unmentioned effects will be clearly understood by those skilled in the art from the following description.

DETAILED DESCRIPTION

Figure 1:
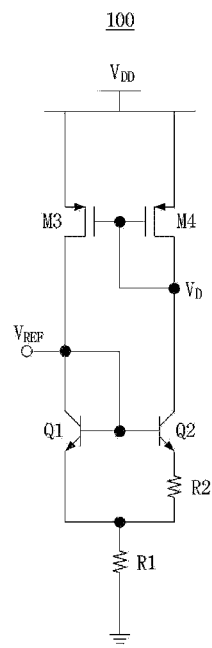
FIG. 1 is a diagram illustrating an example of a band gap reference circuit in the related art.

In order to fully understand the present disclosure, advantages in operation of the present disclosure, and objects achieved by carrying out the present disclosure, the accompanying drawings for explaining exemplary examples of the present disclosure and the contents described with reference to the accompanying drawings need to be referred to.

Hereinafter, preferred embodiments of the present disclosure are described in detail with reference to the accompanying drawings. The same reference numerals among the reference numerals in each drawing indicate the same members.

Figure 2:
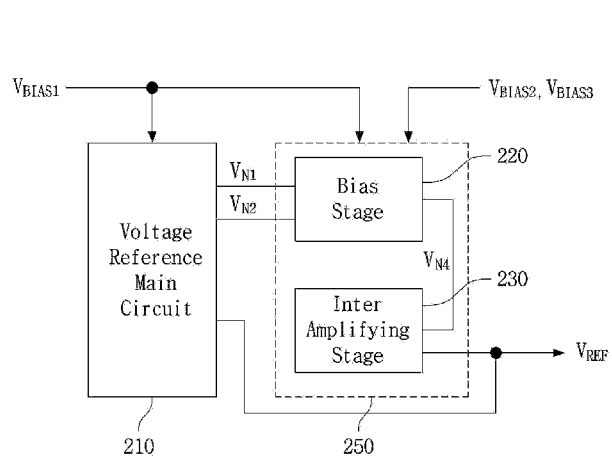
FIG. 2 is a diagram illustrating an embodiment of a band gap reference circuit under a low supply voltage according to the present disclosure.

FIG. 2 is a diagram illustrating an embodiment of a band gap reference circuit 200 under a low supply voltage according to the present disclosure.

Referring to FIG. 2, the band gap reference circuit 200 under a low supply voltage according to the present disclosure includes a band gap reference main circuit unit Voltage Reference Main Circuit 210 and a transimpedance amplifier 250.

The Voltage Reference Main Circuit 210 generates a first node voltage $V_{N1}$ and a second node voltage $V_{N2}$ in response to a first bias voltage $V_{BIAS1}$ and a band gap reference voltage $V_{REF}$.

The transimpedance amplifier 250 includes a bias stage Bias Stage 220 and an inter amplifying stage Inter Amplifying Stage 230 that generate the band gap reference voltage $V_{REF}$ by amplifying the first node voltage $V_{N1}$ and the second node voltage $V_{N2}$ using the first bias voltage $V_{BIAS1}$, a second bias voltage $V_{BIAS2}$, and a third bias voltage $V_{BIAS3}$.

The first bias voltage $V_{BIAS1}$ to the third bias voltage $V_{BIAS3}$ are voltages generated externally and applied to the band gap reference circuit 200 under a low supply voltage according to the present disclosure.

For example, assuming that the voltage level of a power supply voltage $V_{DD}$ is 1.8 V (Volts), the voltage levels of the first bias voltage $V_{BIAS1}$ to the third bias voltage $V_{BIAS3}$ can be set to 0.86 V (Volts), 0.52 V, and 1.34 V, respectively.

Figure 3:
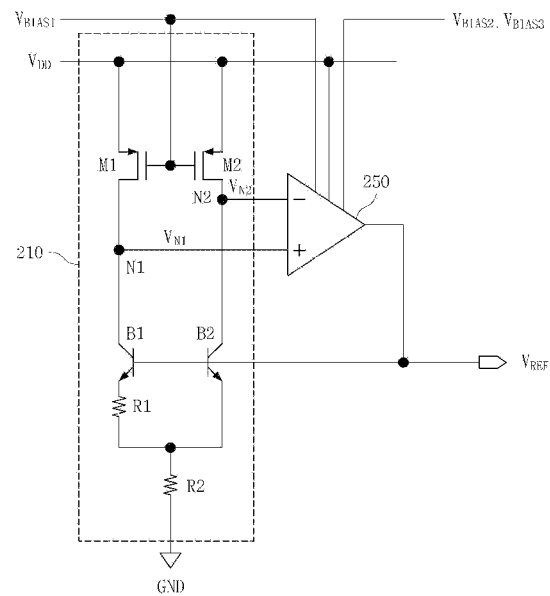
FIG. 3 is a diagram illustrating an embodiment of an internal configuration of a band gap reference circuit under a low supply voltage according to the present disclosure.

FIG. 3 is a diagram illustrating an embodiment of an internal configuration of the band gap reference circuit under a low supply voltage according to the present disclosure.

Referring to FIG. 3, the Voltage Reference Main Circuit 210 includes a first MOS transistor M1, a second MOS transistor M2, a first bipolar transistor B1, a second bipolar transistor B2, a first resistor R1, and a second resistor R2, and the transimpedance amplifier 250 is expressed in the form of a differential amplifier.

The first MOS transistor M1 has one terminal connected to the power supply voltage $V_{DD}$, another terminal connected to a first node N1, and a gate terminal to which the first bias voltage $V_{BIAS1}$ is applied. The second MOS transistor M2 has one terminal connected to the power supply voltage $V_{DD}$, another terminal connected to a second node N2, and a gate terminal to which the first bias voltage $V_{BIAS1}$ is applied. In FIG. 3, the voltage level of the first node N1 is defined as $V_{N1}$ and the voltage level of the second node N2 is defined as $V_{N2}$.

The first bipolar transistor B1 has one terminal connected to the first node N1, and a base terminal to which the band gap reference voltage $V_{REF}$ is applied. The second bipolar transistor B2 has one terminal connected to the second node N2, and a base terminal to which the band gap reference voltage $V_{REF}$ is applied.

The first resistor R1 has one terminal connected to another terminal of the first bipolar transistor B1. The second resistor R2 has one terminal commonly connected to the other terminal of the first resistor R1 and another terminal of the second bipolar transistor B2, and the other terminal connected to a ground voltage GND.

Referring to FIG. 3, it can be seen that the transimpedance amplifier 250 generates the band gap reference voltage $V_{REF}$ by amplifying the first node voltage $V_{N1}$ and the second node voltage $V_{N2}$ using the first bias voltage $V_{BIAS1}$, the second bias voltage $V_{BIAS2}$, and the third bias voltage $V_{BIAS3}$.

Referring to FIG. 3, in order to generate the band gap reference voltage $V_{REF}$ insensitive to temperature changes from the two bipolar transistors B1 and B2, currents flowing through the two MOS transistors M1 and M2 need to be equal to each other by making the voltage levels of the two node voltages $V_{N1}$ and $V_{N2}$ equal to each other, and to this end, the present disclosure proposes the use of the transimpedance amplifier 250.

That is, the transimpedance amplifier 250 generates the band gap reference voltage $V_{REF}$ by amplifying the difference between the two input voltages $V_{N1}$ and $V_{N2}$, and the band gap reference voltage $V_{REF}$ controls currents flowing through the two bipolar transistors B1 and B2, so that the two node voltages $V_{N1}$ and $V_{N2}$ are made equal to each other as a result.

Referring to FIG. 2, the transimpedance amplifier 250 includes the Bias Stage 220 and the Inter Amplifying Stage 230, and actual configurations of the Bias Stage 220 and the Inter Amplifying Stage 230 will be described below. In the following description, the Bias Stage 220 and the Inter Amplifying Stage 230 according to embodiments will be distinguished using reference sign '-'. For example, reference signs of the bias stage 220 according to two embodiments are 220-1 and 220-2, respectively.

Figure 4:
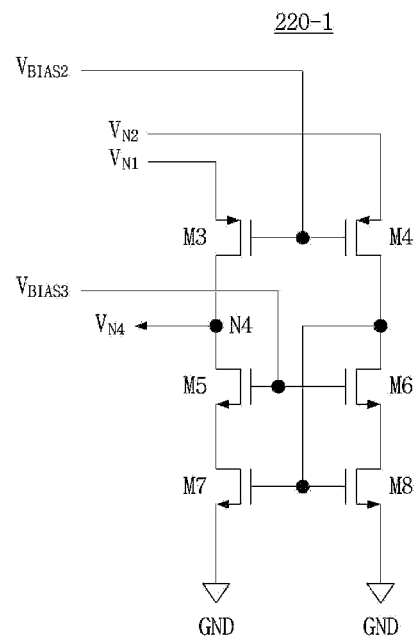
FIG. 4 is a diagram illustrating an embodiment of a bias stage constituting a transimpedance amplifier.

FIG. 4 is a diagram illustrating an embodiment of the bias stage constituting the transimpedance amplifier.

Referring to FIG. 4, the bias stage 220-1 generates a fourth node voltage $V_{N4}$ by using the second bias voltage $V_{BIAS2}$, the third bias voltage $V_{BIAS3}$, the first node voltage $V_{N1}$, and the second node voltage $V_{N2}$, and includes a third MOS transistor M3, a fourth MOS transistor M4, a fifth MOS transistor M5, a sixth MOS transistor M6, a seventh MOS transistor M7, and an eighth MOS transistor M8.

The third MOS transistor M3 has one terminal connected to the first node N1, another terminal connected to a fourth node N4, and a gate terminal to which the second bias voltage $V_{BIAS2}$ is applied.

The fourth MOS transistor M4 has one terminal connected to the second node N2 and a gate terminal to which the second bias voltage $V_{BIAS2}$ is applied.

The fifth MOS transistor M5 has one terminal connected to the fourth node N4, and a gate terminal to which the third bias voltage $V_{BIAS3}$ is applied.

The sixth MOS transistor M6 has one terminal connected to another terminal of the fourth MOS transistor M4, and a gate terminal to which the third bias voltage $V_{BIAS3}$ is applied.

The seventh MOS transistor M7 has one terminal connected to another terminal of the fifth MOS transistor M5, another terminal connected to the ground voltage GND, and a gate terminal connected to a common terminal between the fourth MOS transistor M4 and the sixth MOS transistor M6.

The eighth MOS transistor M8 has one terminal connected to another terminal of the sixth MOS transistor M6, another terminal connected to the ground voltage GND, and a gate terminal connected to the gate terminal of the seventh MOS transistor M7.

In the above description, a voltage level of the fourth node N4 is indicated by $V_{N4}$, the fourth node and the voltage level of the fourth node are the same as the explanation logic for the first node N1 and the second node N2, and the same applies in the following description.

Figure 5:
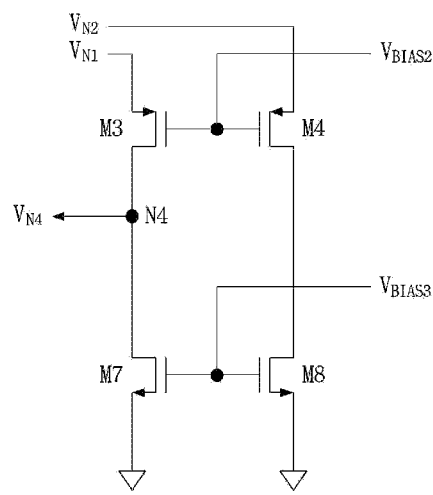
FIG. 5 is a diagram illustrating another embodiment of a bias stage constituting a transimpedance amplifier.

FIG. 5 is a diagram illustrating another embodiment of the bias stage constituting the transimpedance amplifier.

Referring to FIG. 5, the bias stage 220-2 generates the fourth node voltage $V_{N4}$ by using the second bias voltage $V_{BIAS2}$ and the third bias voltage $V_{BIAS3}$, and includes the third MOS transistor M3, the fourth MOS transistor M4, the seventh MOS transistor M7, and the eighth MOS transistor M8.

The third MOS transistor M3 has one terminal connected to the first node N1, another terminal connected to the fourth node N4, and a gate terminal to which the second bias voltage $V_{BIAS2}$ is applied.

The fourth MOS transistor M4 has one terminal connected to the second node N2 and a gate terminal to which the second bias voltage $V_{BIAS2}$ is applied.

The seventh MOS transistor M7 has one terminal connected to the fourth node N4, another terminal connected to the ground voltage GND, and a gate terminal to which the third bias voltage $V_{BIAS3}$ is applied.

The eighth MOS transistor M8 has one terminal connected to another terminal of the fourth MOS transistor M4, another terminal connected to the ground voltage GND, and a gate terminal to which the third bias voltage $V_{BIAS3}$ is applied.

The third MOS transistor M3 and the fourth MOS transistor M4 are P-type MOS transistors, the fifth MOS transistor M5 to the eighth MOS transistor M8 are N-type MOS transistors, and the same applies in the following description.

In FIGS. 4 and 5, the fourth node N4 generates the fourth node voltage $V_{N4}$ in the same manner.

Figure 6:
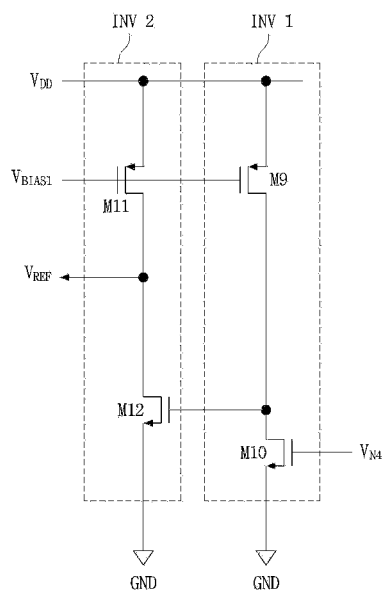
FIG. 6 is a diagram illustrating a specific embodiment of an inter amplifying stage.

FIG. 6 is a diagram illustrating a specific embodiment of the inter amplifying stage.

Referring to FIG. 6, the Inter Amplifying Stage 230-1 generates the band gap reference voltage $V_{REF}$ by amplifying the applied fourth node voltage $V_{N4}$, and to this end, includes two amplifiers INV1 and INV2 serially connected to each other.

The first amplifier INV1 includes a ninth MOS transistor M9 having one terminal connected to the power supply voltage $V_{DD}$ and a gate terminal to which the first bias voltage $V_{BIAS1}$ is applied, and a tenth MOS transistor M10 having one terminal connected to another terminal of the ninth MOS transistor M9, another terminal connected to the ground voltage GND, and a gate terminal to which the fourth node voltage $V_{N4}$ is applied.

The second amplifier INV2 includes an eleventh MOS transistor M11 having one terminal connected to the power supply voltage $V_{DD}$, a gate terminal to which the first bias voltage $V_{BIAS1}$ is applied, and a twelfth MOS transistor M12 having one terminal connected to another terminal of the eleventh MOS transistor M11, another terminal connected to the ground voltage GND, and a gate terminal connected to a common terminal between the ninth MOS transistor M9 being an output terminal of the first amplifier INV1 and the tenth MOS transistor M10.

The band gap reference voltage $V_{REF}$ is output to a common terminal between the eleventh MOS transistor M11 and the twelfth MOS transistor M12.

Figure 7:
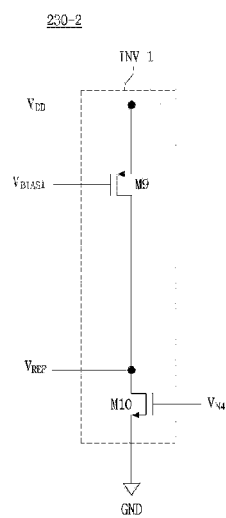
FIG. 7 is a diagram illustrating a specific embodiment of an inter amplifying stage.

FIG. 7 is a diagram illustrating a specific embodiment of the inter amplifying stage.

Referring to FIG. 7, the Inter Amplifying Stage 230-2 generates the band gap reference voltage $V_{REF}$ by amplifying the applied fourth node voltage $V_{N4}$, and to this end, includes one amplifier INV1.

The first amplifier INV1 includes a ninth MOS transistor M9 having one terminal connected to the power supply voltage $V_{DD}$, another terminal that generates the band gap reference voltage $V_{REF}$, and a gate terminal to which the first bias voltage $V_{BIAS1}$ is applied, and a tenth MOS transistor M10 having one terminal that generates the band gap reference voltage $V_{REF}$, another terminal connected to the ground voltage GND, and a gate terminal to which the fourth node voltage $V_{N4}$ is applied.

The two amplifiers INV1 and INV2 included in the Inter Amplifying Stage 230 have the same structure as an inverter, and one of the electrical characteristics of the inverter may be the amplification of an input signal.

In the structures of the inverters illustrated in FIGS. 6 and 7, the ninth MOS transistor M9 and the eleventh MOS transistor M11 serve as loads, respectively.

Figure 8:
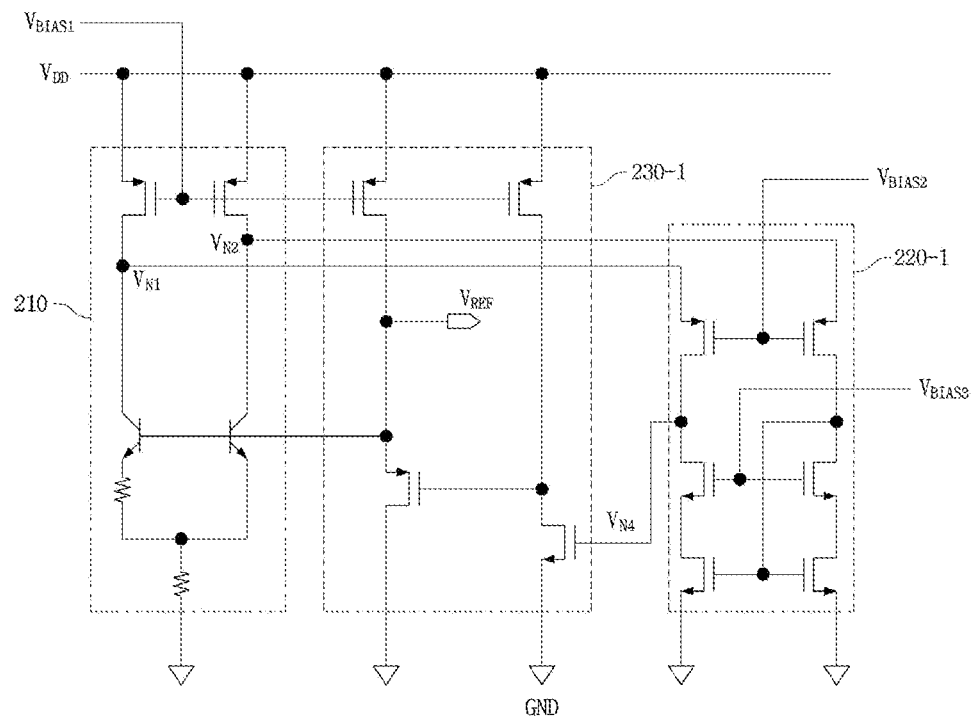
FIG. 8 is a diagram illustrating a specific embodiment of a band gap reference circuit under a low supply voltage according to the present disclosure.

FIG. 8 is a diagram illustrating a specific embodiment of the band gap reference circuit under a low supply voltage according to the present disclosure.

Figure 9:
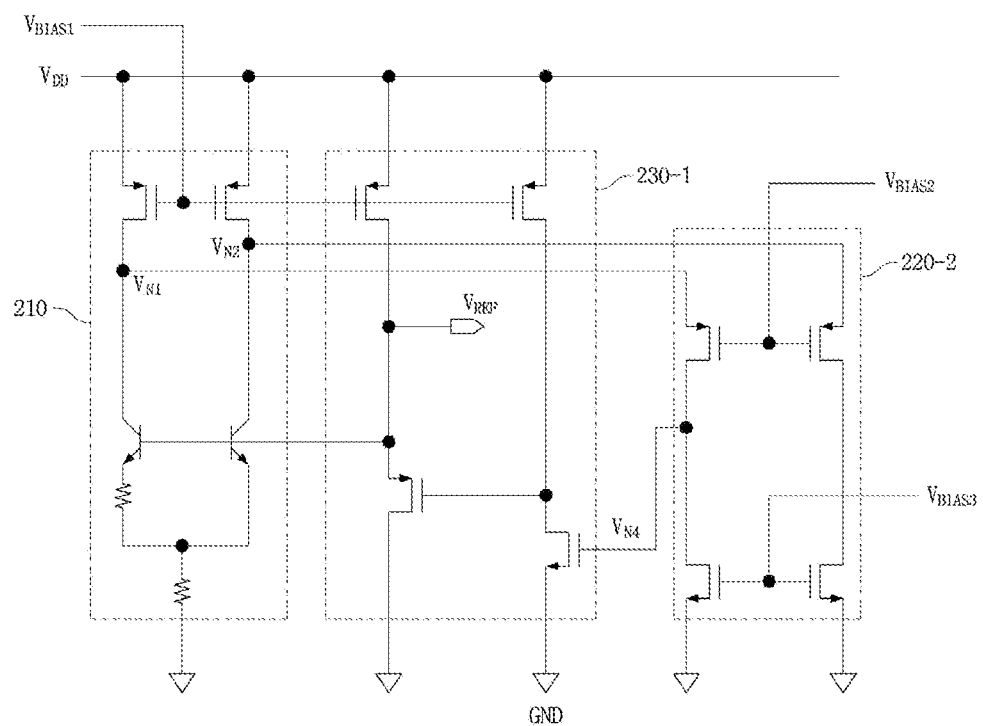
FIG. 9 is a diagram illustrating another specific embodiment of a band gap reference circuit under a low supply voltage according to the present disclosure.

FIG. 9 is a diagram illustrating another specific embodiment of the band gap reference circuit under a low supply voltage according to the present disclosure.

Referring to FIG. 8, the band gap reference circuit 200 under a low supply voltage according to the present disclosure includes a main circuit unit 210 and a transimpedance amplifier 250, and the transimpedance amplifier 250 includes the bias stage 220-1 illustrated in FIG. 4 and the Inter Amplifying Stage 230-1 illustrated in FIG. 6.

Referring to FIG. 9, the band gap reference circuit 200 under a low supply voltage according to the present disclosure includes a main circuit unit 210 and a transimpedance amplifier 250, and the transimpedance amplifier 250 includes the bias stage 220-2 illustrated in FIG. 5 and the Inter Amplifying Stage 230-1 illustrated in FIG. 6.

Although the technical spirit of the present disclosure has been described together with the accompanying drawings, this is an illustrative example of a preferred embodiment of the present disclosure, but does not limit the present disclosure. In addition, it is clear that various modifications and imitations can be made by anyone skilled in the art to which the present disclosure belongs without departing from the scope of the technical spirit of the present disclosure.

What is claimed is:

1. A band gap reference circuit under a low supply voltage comprising:
    a voltage reference main circuit configured to generate a first node voltage and a second node voltage in response to a first bias voltage and a band gap reference voltage; and
    a transimpedance amplifier configured to generate the band gap reference voltage by amplifying a difference between the first node voltage and the second node voltage using the first bias voltage, a second bias voltage, and a third bias voltage,
    wherein the voltage reference main circuit comprises:
    a first MOS transistor including one terminal connected to a power supply voltage, another terminal connected to a first node that generates the first node voltage, and a gate terminal to which the first bias voltage is applied;
    a second MOS transistor including one terminal connected to the power supply voltage, another terminal connected to a second node that generates the second node voltage, and a gate terminal to which the first bias voltage is applied;
    a first bipolar transistor including one terminal connected to the first node and a base terminal to which the band gap reference voltage is applied;
    a second bipolar transistor including one terminal connected to the second node, another terminal connected to a ground voltage, and a base terminal to which the band gap reference voltage is applied; and
    a first resistor including one terminal connected to another terminal of the first bipolar transistor and another terminal connected to the ground voltage.

2. The band gap reference circuit under a low supply voltage of claim 1, further comprising:
    a second resistor including one terminal commonly connected to the other terminal of the first resistor and the another terminal of the second bipolar transistor, and another terminal connected to the ground voltage.

3. The band gap reference circuit under a low supply voltage of claim 1, wherein the transimpedance amplifier comprises:
    a bias stage configured to generate a fourth node voltage by using the second bias voltage, the third bias voltage, the first node voltage, and the second node voltage; and
    an inter amplifying stage configured to generate the band gap reference voltage by amplifying the fourth node voltage using the first bias voltage.

4. The band gap reference circuit under a low supply voltage of claim 3, wherein the bias stage comprises:
    a third MOS transistor including one terminal connected to the first node that generates the first node voltage, another terminal connected to a fourth node that generates the fourth node voltage, and a gate terminal to which the second bias voltage is applied;
    a fourth MOS transistor including one terminal connected to the second node that generates the second node voltage and a gate terminal to which the second bias voltage is applied;
    a fifth MOS transistor including one terminal connected to the fourth node and a gate terminal to which the third bias voltage is applied;
    a sixth MOS transistor including one terminal connected to another terminal of the fourth MOS transistor and a gate terminal to which the third bias voltage is applied;
    a seventh MOS transistor including one terminal connected to another terminal of the fifth MOS transistor, another terminal connected to the ground voltage, and a gate terminal connected to a common terminal between the fourth MOS transistor and the sixth MOS transistor; and
    an eighth MOS transistor including one terminal connected to another terminal of the sixth MOS transistor, another terminal connected to the ground voltage, and a gate terminal connected to the gate terminal of the seventh MOS transistor.

5. The band gap reference circuit under a low supply voltage of claim 3, wherein the bias stage comprises:
    a third MOS transistor including one terminal connected to the first node that generates the first node voltage, another terminal connected to a fourth node that generates the fourth node voltage, and a gate terminal to which the second bias voltage is applied;
    a fourth MOS transistor including one terminal connected to the second node that generates the second node voltage and a gate terminal to which the second bias voltage is applied;
    a seventh MOS transistor including one terminal connected to the fourth node, another terminal connected to the ground voltage, and a gate terminal to which the third bias voltage is applied; and
    an eighth MOS transistor including one terminal connected to another terminal of the fourth MOS transistor, another terminal connected to the ground voltage, and a gate terminal to which the third bias voltage is applied.

6. The band gap reference circuit under a low supply voltage of claim 3, wherein the inter amplifying stage comprises:
    a first amplifier configured to amplify the fourth node voltage; and
    a second amplifier configured to generate the band gap reference voltage by amplifying an output of the first amplifier.

7. The band gap reference circuit under a low supply voltage of claim 6, wherein the first amplifier comprises:
    a ninth MOS transistor including one terminal connected to the power supply voltage and a gate terminal to which the first bias voltage is applied; and
    a tenth MOS transistor including one terminal connected to another terminal of the ninth MOS transistor, another terminal connected to the ground voltage, and a gate terminal to which the fourth node voltage is applied.

8. The band gap reference circuit under a low supply voltage of claim 7, wherein the second amplifier comprises:
    an eleventh MOS transistor including one terminal connected to the power supply voltage, another terminal that generates the band gap reference voltage, and a gate terminal to which the first bias voltage is applied; and a twelfth MOS transistor including one terminal that generates the band gap reference voltage, another terminal connected to the ground voltage, and a gate terminal connected to a common terminal between the ninth MOS transistor and the tenth MOS transistor.

9. The band gap reference circuit under a low supply voltage of claim 8, wherein the inter amplifying stage comprises:
a ninth MOS transistor including one terminal connected to the power supply voltage and another terminal that generates the band gap reference voltage; and
a tenth MOS transistor including one terminal that generates the band gap reference voltage, another terminal connected to the ground voltage, and a gate terminal to which the fourth node voltage is applied.

10. A band gap reference circuit under a low supply voltage comprising:
a voltage reference main circuit configured to generate a first node voltage and a second node voltage in response to a first bias voltage and a band gap reference voltage;
a bias stage configured to generate a fourth node voltage by using a second bias voltage, a third bias voltage, the first node voltage, and the second node voltage; and
an inter amplifying stage configured to generate the band gap reference voltage by amplifying the fourth node voltage using the first bias voltage,
wherein the voltage reference main circuit comprises:
a first MOS transistor including one terminal connected to a power supply voltage, another terminal connected to a first node that generates the first node voltage, and a gate terminal to which the first bias voltage is applied;
a second MOS transistor including one terminal connected to the power supply voltage, another terminal connected to a second node that generates the second node voltage, and a gate terminal to which the first bias voltage is applied;
a first bipolar transistor including one terminal connected to the first node and a base terminal to which the band gap reference voltage is applied;
a second bipolar transistor including one terminal connected to the second node, another terminal connected to a ground voltage, and a base terminal to which the band gap reference voltage is applied; and
a first resistor including one terminal connected to another terminal of the first bipolar transistor and another terminal connected to the ground voltage.

11. The band gap reference circuit under a low supply voltage of claim 10, further comprising:
a second resistor including one terminal commonly connected to the another terminal of the first resistor and the another terminal of the second bipolar transistor, and another terminal connected to the ground voltage.

12. The band gap reference circuit under a low supply voltage of claim 10, wherein the bias stage comprises:
a third MOS transistor including one terminal connected to the first node that generates the first node voltage, another terminal connected to a fourth node that generates the fourth node voltage, and a gate terminal to which the second bias voltage is applied;
a fourth MOS transistor including one terminal connected to the second node that generates the second node voltage and a gate terminal to which the second bias voltage is applied;
a fifth MOS transistor including one terminal connected to the fourth node and a gate terminal to which the third bias voltage is applied;
a sixth MOS transistor including one terminal connected to another terminal of the fourth MOS transistor and a gate terminal to which the third bias voltage is applied;
a seventh MOS transistor including one terminal connected to another terminal of the fifth MOS transistor, another terminal connected to the ground voltage, and a gate terminal connected to a common terminal between the fourth MOS transistor and the sixth MOS transistor; and
an eighth MOS transistor including one terminal connected to another terminal of the sixth MOS transistor, another terminal connected to the ground voltage, and a gate terminal connected to the gate terminal of the seventh MOS transistor.

13. The band gap reference circuit under a low supply voltage of claim 10, wherein the bias stage comprises:
a third MOS transistor including one terminal connected to the first node that generates the first node voltage, another terminal connected to a fourth node that generates the fourth node voltage, and a gate terminal to which the second bias voltage is applied;
a fourth MOS transistor including one terminal connected to the second node that generates the second node voltage and a gate terminal to which the second bias voltage is applied;
a seventh MOS transistor including one terminal connected to the fourth node, another terminal connected to the ground voltage, and a gate terminal to which the third bias voltage is applied; and
an eighth MOS transistor including one terminal connected to another terminal of the fourth MOS transistor, another terminal connected to the ground voltage, and a gate terminal to which the third bias voltage is applied.

14. The band gap reference circuit under a low supply voltage of claim 10, wherein the inter amplifying stage comprises:
a first amplifier configured to amplify the fourth node voltage; and
a second amplifier configured to generate the band gap reference voltage by amplifying an output of the first amplifier.

15. The band gap reference circuit under a low supply voltage of claim 14, wherein the first amplifier comprises:
a ninth MOS transistor including one terminal connected to the power supply voltage and a gate terminal to which the first bias voltage is applied; and
a tenth MOS transistor including one terminal connected to another terminal of the ninth MOS transistor, another terminal connected to the ground voltage, and a gate terminal to which the fourth node voltage is applied.

16. The band gap reference circuit under a low supply voltage of claim 15, wherein the second amplifier comprises:
an eleventh MOS transistor including one terminal connected to the power supply voltage, another terminal that generates the band gap reference voltage, and a gate terminal to which the first bias voltage is applied; and
a twelfth MOS transistor including one terminal that generates the band gap reference voltage, another terminal connected to the ground voltage, and a gate terminal connected to a common terminal between the ninth MOS transistor and the tenth MOS transistor.

17. The band gap reference circuit under a low supply voltage of claim 10, wherein the inter amplifying stage comprises:

a ninth MOS transistor including one terminal connected to the power supply voltage and another terminal that generates the band gap reference voltage; and a tenth MOS transistor including one terminal that generates the band gap reference voltage, another terminal connected to the ground voltage, and a gate terminal to which the fourth node voltage is applied.

18. The band gap reference circuit under a low supply voltage of claim 10, wherein voltage levels of the power supply voltage, the first bias voltage, the second bias voltage, the third bias voltage are 1.8 V (volts), 0.86 V, 0.52 V, and 1.34 V, respectively.

\* \* \* \* \*